United States Patent
Finkbeiner et al.

(10) Patent No.: US 12,191,857 B2
(45) Date of Patent: *Jan. 7, 2025

(54) MEMORY DEVICE PROCESSING

(71) Applicant: Lodestar Licensing Group, LLC, Evanston, IL (US)

(72) Inventors: Timothy P Finkbeiner, Boise, ID (US); Troy D. Larsen, Meridian, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/448,071

(22) Filed: Aug. 10, 2023

(65) Prior Publication Data
US 2024/0113714 A1    Apr. 4, 2024

Related U.S. Application Data

(63) Continuation of application No. 17/359,982, filed on Jun. 28, 2021, now Pat. No. 11,728,813, which is a continuation of application No. 16/553,443, filed on Aug. 28, 2019, now Pat. No. 11,050,425, which is a continuation of application No. 16/432,236, filed on Jun. 5, 2019, now Pat. No. 10,581,434, which is a continuation of application No. 16/161,825, filed on Oct. 16, 2018, now Pat. No. 10,483,978.

(51) Int. Cl.
H03K 19/1776    (2020.01)
G06F 3/06       (2006.01)
G11C 16/26      (2006.01)

(52) U.S. Cl.
CPC ....... *H03K 19/1776* (2013.01); *G06F 3/0625* (2013.01); *G06F 3/0688* (2013.01); *G11C 16/26* (2013.01)

(58) Field of Classification Search
CPC ........ H03K 19/1776; G11C 7/06; G11C 7/10; G11C 16/02; G11C 16/06; G11C 16/026; G06F 3/06; G06F 3/0604; G06F 3/0688
See application file for complete search history.

(56) References Cited

U.S. PATENT DOCUMENTS

| | | |
|---|---|---|
| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

(Continued)

*Primary Examiner* — Jason M Crawford

(57) ABSTRACT

An example apparatus includes a memory device comprising a plurality of banks of memory cells. A particular bank of memory cells among the plurality of banks includes a system processor resident on a particular bank of the plurality of banks.

20 Claims, 9 Drawing Sheets

(56) References Cited

U.S. PATENT DOCUMENTS

| | | |
|---|---|---|
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B2 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,419,620 B2 * | 8/2016 | Susnow .................. H04N 19/96 |
| 9,653,141 B2 | 3/2017 | Kim et al. |

(56) References Cited

U.S. PATENT DOCUMENTS

| | | |
|---|---|---|
| 9,659,605 B1 | 5/2017 | Zawodny et al. |
| 9,659,610 B1 | 5/2017 | Hush |
| 9,697,876 B1 | 7/2017 | Tiwari et al. |
| 9,761,300 B1 | 9/2017 | Willcock |
| 9,997,212 B1 | 6/2018 | Finkbeiner et al. |
| 10,061,541 B1* | 8/2018 | Lee .................. G11C 11/40611 |
| 10,068,664 B1 | 9/2018 | Penney et al. |
| 10,483,978 B1* | 11/2019 | Finkbeiner ............. G06F 3/0625 |
| 10,581,434 B1* | 3/2020 | Finkbeiner ............ G11C 7/1012 |
| 11,050,425 B2* | 6/2021 | Finkbeiner ............ G11C 7/1012 |
| 11,313,895 B2* | 4/2022 | Andle ..................... G01R 31/12 |
| 11,514,957 B2* | 11/2022 | Lea ........................ G11C 7/1048 |
| 11,728,813 B2* | 8/2023 | Finkbeiner ............ G06F 3/0688 |
| | | 326/38 |
| 2001/0007112 A1 | 7/2001 | Porterfield |
| 2001/0008492 A1 | 7/2001 | Higashiho |
| 2001/0010057 A1* | 7/2001 | Yamada ............. G06F 15/7821 |
| | | 715/234 |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0014168 A1* | 1/2007 | Rajan ...................... G11C 29/24 |
| | | 365/201 |
| 2007/0079185 A1* | 4/2007 | Totolos ................. G06F 11/106 |
| | | 714/718 |
| 2007/0103986 A1 | 5/2007 | Chen |
| 2007/0156947 A1* | 7/2007 | Vaithiananthan ..... G06F 12/109 |
| | | 711/E12.066 |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0204383 A1* | 8/2009 | Weiss ..................... G06F 11/261 |
| | | 703/28 |
| 2009/0254697 A1 | 10/2009 | Akerib |
| 2009/0292908 A1* | 11/2009 | Grabner ............. G06F 9/30163 |
| | | 712/229 |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0127816 A1* | 5/2012 | Kajigaya ............. G11C 11/4097 |
| | | 365/205 |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0092508 A1 | 4/2015 | Bains |
| 2015/0120987 A1 | 4/2015 | Wheeler |
| 2015/0134713 A1 | 5/2015 | Wheeler |
| 2015/0162068 A1 | 6/2015 | Woo et al. |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |

(56) References Cited

U.S. PATENT DOCUMENTS

| | | |
|---|---|---|
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |
| 2016/0266873 A1 | 9/2016 | Tiwari et al. |
| 2016/0266899 A1 | 9/2016 | Tiwari |
| 2016/0267951 A1 | 9/2016 | Tiwari |
| 2016/0292080 A1 | 10/2016 | Leidel et al. |
| 2016/0306584 A1 | 10/2016 | Zawodny et al. |
| 2016/0306614 A1 | 10/2016 | Leidel et al. |
| 2016/0350230 A1 | 12/2016 | Murphy |
| 2016/0365129 A1 | 12/2016 | Willcock |
| 2016/0371033 A1 | 12/2016 | La Fratta et al. |
| 2017/0052906 A1 | 2/2017 | Lea |
| 2017/0178701 A1 | 6/2017 | Willcock et al. |
| 2017/0192844 A1 | 7/2017 | Lea et al. |
| 2017/0228192 A1 | 8/2017 | Willcock et al. |
| 2017/0235515 A1 | 8/2017 | Lea et al. |
| 2017/0236564 A1 | 8/2017 | Zawodny et al. |
| 2017/0242902 A1 | 8/2017 | Crawford et al. |
| 2017/0243623 A1 | 8/2017 | Kirsch et al. |
| 2017/0262369 A1 | 9/2017 | Murphy |
| 2017/0263306 A1 | 9/2017 | Murphy |
| 2017/0269865 A1 | 9/2017 | Willcock et al. |
| 2017/0269903 A1 | 9/2017 | Tiwari |
| 2017/0277433 A1 | 9/2017 | Willcock |
| 2017/0277440 A1 | 9/2017 | Willcock |
| 2017/0277581 A1 | 9/2017 | Lea et al. |
| 2017/0277637 A1 | 9/2017 | Willcock et al. |
| 2017/0278559 A1 | 9/2017 | Hush |
| 2017/0278584 A1* | 9/2017 | Rosti ............. G11C 29/16 |
| 2017/0285988 A1* | 10/2017 | Dobelstein ............ G11C 11/408 |
| 2017/0293434 A1 | 10/2017 | Tiwari |
| 2017/0301379 A1 | 10/2017 | Hush |
| 2017/0309314 A1 | 10/2017 | Zawodny et al. |
| 2017/0329577 A1 | 11/2017 | Tiwari |
| 2017/0336989 A1* | 11/2017 | Zawodny ............. G11C 29/28 |
| 2017/0337126 A1 | 11/2017 | Zawodny et al. |
| 2017/0337953 A1 | 11/2017 | Zawodny et al. |
| 2017/0352391 A1 | 12/2017 | Hush |
| 2017/0358357 A1* | 12/2017 | Hung ............. G11C 16/16 |
| 2017/0371539 A1 | 12/2017 | Mai et al. |
| 2018/0012636 A1 | 1/2018 | Alzheimer et al. |
| 2018/0024769 A1 | 1/2018 | Howe et al. |
| 2018/0024926 A1 | 1/2018 | Penney et al. |
| 2018/0024964 A1* | 1/2018 | Mao ............. G06F 3/0655 |
| | | 711/173 |
| 2018/0025759 A1 | 1/2018 | Penney et al. |
| 2018/0025768 A1 | 1/2018 | Hush |
| 2018/0032458 A1 | 2/2018 | Bell |
| 2018/0033478 A1 | 2/2018 | Lea et al. |
| 2018/0039484 A1 | 2/2018 | La Fratta et al. |
| 2018/0046405 A1 | 2/2018 | Hush et al. |
| 2018/0046461 A1 | 2/2018 | Tiwari |
| 2018/0060069 A1 | 3/2018 | Rosti et al. |
| 2018/0074754 A1* | 3/2018 | Crawford, Jr. ........ G06F 3/0625 |
| 2018/0075899 A1 | 3/2018 | Hush |
| 2018/0088850 A1 | 3/2018 | Willcock |
| 2018/0102147 A1 | 4/2018 | Willcock et al. |
| 2018/0108397 A1 | 4/2018 | Venkata et al. |
| 2018/0121089 A1* | 5/2018 | Lee .................. G06F 3/061 |
| 2018/0130515 A1 | 5/2018 | Zawodny et al. |
| 2018/0136871 A1 | 5/2018 | Leidel |
| 2018/0165144 A1* | 6/2018 | Raj ............. G06F 11/0766 |
| 2018/0239531 A1 | 8/2018 | Lea |
| 2018/0239712 A1 | 8/2018 | Lea |
| 2018/0240510 A1 | 8/2018 | Hush et al. |
| 2018/0294027 A1 | 10/2018 | Murphy |
| 2018/0357007 A1* | 12/2018 | Zawodny ................. G11C 7/06 |
| 2019/0034116 A1* | 1/2019 | Zawodny ............. G11C 7/1006 |
| 2019/0042407 A1* | 2/2019 | Gao ....................... G06F 3/0688 |
| 2019/0065788 A1* | 2/2019 | Vijayasankar ......... G06F 3/0608 |
| 2019/0243548 A1* | 8/2019 | Duncan ................. G06F 3/0619 |
| 2019/0347035 A1* | 11/2019 | Hasbun ................. G06F 3/0659 |
| 2019/0348090 A1* | 11/2019 | Hasbun ................... G06F 13/36 |
| 2020/0119735 A1* | 4/2020 | Finkbeiner .......... G06F 15/7821 |
| 2020/0358548 A1* | 11/2020 | Fabbri ................ H04J 14/0278 |
| 2021/0173557 A1* | 6/2021 | Mai ....................... G06F 3/0659 |
| 2021/0328590 A1* | 10/2021 | Finkbeiner ........... G11C 7/1012 |
| 2023/0070383 A1* | 3/2023 | Lea ...................... G11C 7/1006 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1999 |
| KR | 10-2010-0134235 | 12/2010 |
| KR | 10-2013-0049421 | 5/2013 |
| KR | 10-2013-0119544 | 11/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, mailed Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Stojmenovic, "Multiplicative Circulant Networks Topological Properties and Communication Algorithms", (25 pgs.), Discrete Applied Mathematics 77 (1997) 281-305.

(56) References Cited

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.
Elliot, et al., "Computational RAM: Implementing Processors in Memory", Jan.-Mar. 1999, (10 pgs.), vol. 16, Issue 1, IEEE Design and Test of Computers Magazine.
International Search Report and Written Opinion for related PCT Application No. PCT/US2019/052365, dated Jan. 10, 2020, 12 pages.
Search Report from related European Patent Application No. 19872490.8, dated Jun. 13, 2022, 9 pages.

\* cited by examiner

| | | 744 | 745 | 756 | 770 | 771 |
|---|---|---|---|---|---|---|
| | | A | B | NOT OPEN | OPEN TRUE | OPEN INVERT |
| | | 0 | 0 | 0 | 0 | 1 |
| | | 0 | 1 | 0 | 1 | 0 |
| 775 | | | | | | |
| | | 1 | 0 | 1 | 0 | 1 |
| | | 1 | 1 | 1 | 1 | 0 |

7-1

| | FF | 0 | 0 | 0 | 0 | 0 | 0 | 1 | 1 | 1 | ← 776 |
| --- | --- | --- | --- | --- | --- | --- | --- | --- | --- | --- | --- |
| | FT | 0 | 0 | 0 | 1 | 1 | 1 | 0 | 0 | 0 | ← 777 |
| | TF | 0 | 0 | 1 | 0 | 0 | 1 | 0 | 0 | 1 | ← 778 |
| | TT | 0 | 1 | 0 | 0 | 1 | 0 | 0 | 1 | 0 | ← 779 |
| A | B | A | A*B | A*$\bar{B}$ | A+B | B | AXB | A+$\bar{B}$ | $\overline{AXB}$ | $\bar{B}$ | ← 747 |
| 0 | 0 | 0 | 0 | 0 | 0 | 0 | 0 | 1 | 1 | 1 | |
| 0 | 1 | 0 | 0 | 0 | 1 | 1 | 1 | 0 | 0 | 0 | |
| 1 | 0 | 1 | 0 | 1 | 1 | 0 | 1 | 1 | 0 | 1 | |
| 1 | 1 | 1 | 1 | 0 | 1 | 1 | 0 | 1 | 1 | 0 | |

MEMORY DEVICE PROCESSING

PRIORITY INFORMATION

This application is a Continuation of U.S. application Ser. No. 17/359,982, filed Jun. 28, 2021, which issues as U.S. Pat. No. 11,728,813 on Aug. 15, 2023, which is a Continuation of U.S. application Ser. No. 16/553,443, filed Aug. 28, 2019, which issued as U.S. Pat. No. 11,050,425 on Jun. 29, 2021, which is a Continuation of U.S. application Ser. No. 16/432,236, filed Jun. 5, 2019, which issued as U.S. Pat. No. 10,581,434 on Mar. 3, 2020, which is a Continuation of U.S. application Ser. No. 16/161,825, filed on Oct. 16, 2018, which issued as U.S. Pat. No. 10,483,978 on Nov. 19, 2019, the contents of which are incorporated herein by reference.

TECHNICAL FIELD

The present disclosure relates generally to semiconductor memory and methods, and more particularly, to apparatuses and methods for memory device application processing.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and/or data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and/or data may also be sequenced and/or buffered. A sequence to complete an operation in one or more clock cycles may be referred to as an operation cycle. Time consumed to complete an operation cycle costs in terms of processing and computing performance and power consumption, of a computing apparatus and/or system.

In many instances, the processing resources (e.g., processor and associated functional unit circuitry) may be external to the memory array, and data is accessed via a bus between the processing resources and the memory array to execute a set of instructions. Processing performance may be improved in a processor-in-memory (PIM) device, in which a processor may be implemented internally and near to a memory (e.g., directly on a same chip as the memory array). A processing-in-memory device may save time and/or power by reducing and/or eliminating external communications.

BRIEF DESCRIPTION OF THE DRAWINGS

FIG. 7 is a logic table illustrating selectable logic operation results implemented by a sensing circuitry shown in FIG. 5 in accordance with a number of embodiments of the present disclosure.

DETAILED DESCRIPTION

Figure 1:
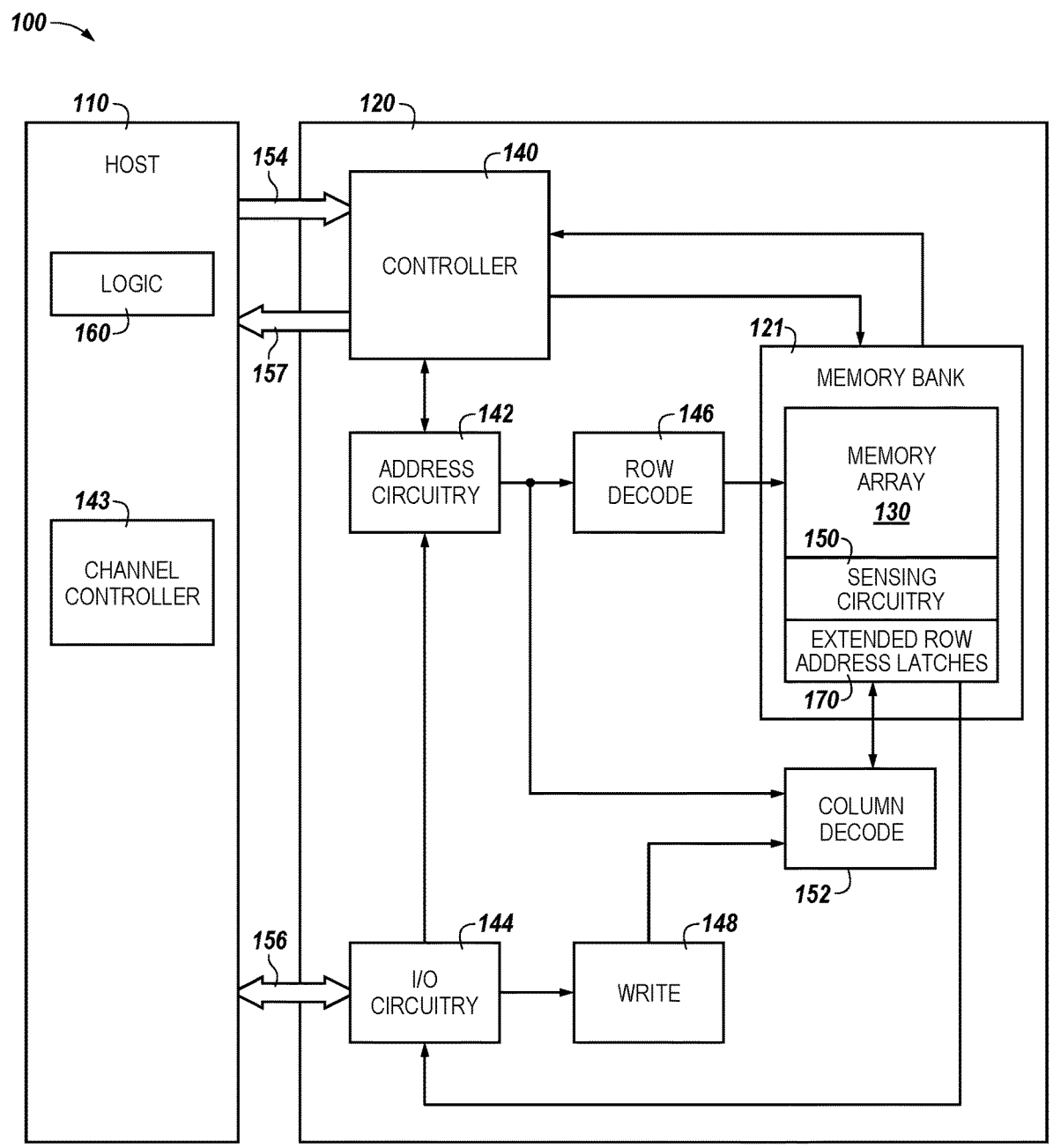
FIG. 1 is a block diagram of an apparatus in the form of a computing system including a memory device in accordance with a number of embodiments of the present disclosure.

The present disclosure includes apparatuses and methods for memory device processing. An example apparatus includes a plurality of banks of memory cells, where a particular bank of memory cells among the plurality of banks includes a system processor resident on a particular bank among the plurality of banks. In some embodiments, the system processor can be configured to control memory operations performed using the plurality of banks.

A memory (e.g., one or more memory device(s)) may include a plurality of banks (e.g., memory banks) that can store data and/or be configured to perform memory operations for the memory device. In some approaches, coordination of memory operations and/or data storage for the memory can be controlled by circuitry external to the memory. For example, in some approaches, a host computing device coupled to the memory can control coordination and/or performance of memory operations for the memory. However, controlling memory device operations via circuitry external to the memory device may be inefficient due to transfer times associated with transferring commands to and from the memory device.

For example, as an amount of data transferred between a host computing device and various memory devices increases, bandwidth bottlenecks can reduce performance of the computing system as a whole. This can be further exacerbated in Internet-of-Things (IoT) applications in which multiple disparate memory devices may be ingesting data that may ultimately be transferred to a host. In such applications, providing control circuitry resident on the memory device, as described herein, can allow for at least a portion of the data ingested by a memory device to be processed locally at the memory device prior to transfer of the data to a location external to the memory device (e.g., to a host).

Accordingly, embodiments of the present disclosure can provide control circuitry that is resident on (e.g., tightly coupled to) the memory device to, for example, reduce command transfer times to and from the memory device. In some embodiments, a system processor may be resident (e.g., located or deployed) on one more memory banks of the memory device and/or may be resident on the memory device. As used herein, the term "resident on" refers to something that is physically located on a particular component. For example, the system processor being "resident on" a particular memory bank refers to a condition in which the system processor is physically coupled to the particular memory bank. The term "resident on" may be used interchangeably with other terms such as "deployed on" or "located on," herein.

As used herein, a "system processor" refers to a processing device that is used to perform primary processing functions for a memory. For example, a system processor can perform processing functions such as central processing for the memory, coordination of data storage for the memory, transfer of data to, from, and/or within the memory, host or control circuitry functions, etc. A non-limiting example of a system processor is a reduced instruction set computer (RISC-V) deployed as a system-on-a-chip and configured to perform processing functions for the memory. In the above non-limiting example, the system processor may be a RISC-V device that includes increased processing power over other processors (e.g., bank processors) associated with the memory. For example, the system processor may be a 64-bit RISC-V device, while other processors associated with the memory may be 32-bit RISC-V devices.

For example, the system processor can be responsible for executing programs and/or applications and/or may be in charge of control flow(s) associated with execution of the programs and/or instructions. Such programs and/or instructions can, in some embodiments, include sending and/or receiving instructions to memory banks for performing memory operations and/or processing-in-memory (PIM) operations in association with executing the program and/or application. Further, the system processor can be responsible for orchestrating tasks performed by other memory device processors such as bank processors. For example, the system processor can be responsible for orchestrating execution of various routines (e.g., library routines), sub-routines, portions of routines, etc. to be performed by the bank processors. Accordingly, in some examples, the system processor can act as a master or supervisory processing device to control operation of bank processors resident on (e.g., located or deployed) on a memory device.

Because the system processor may be tightly coupled to the memory device (as opposed to some approaches in which processing for the memory is conducted external to the memory), in some embodiments, a quantity of commands transferred to and/or from the host may be reduced, thereby increasing performance of the memory device. For example, since the system processor may provide at least a portion of the functionality of the host or other control circuitry, the number of commands transferred to and/or from the memory device in the performance of memory device operations may be reduced thereby reducing time delays associated with operating the memory device, which may lead to increased performance of the memory device, host, or computing environment in which the memory device is deployed.

In addition to reducing transfer time for commands to control memory device operations providing control circuitry to the memory device (either by providing control circuitry to one or more of the memory banks and/or by providing control circuitry on the memory device), a quantity of very long instruction word machines may be reduced, fewer extended row address (XRA) components (e.g., XRA latches or registers) may be employed, fewer bridges may be employed, and/or simplification and/or size reduction to row address strobe chain control modules may be provided in comparison to approaches in which control circuitry for a memory device is provided external to the memory device.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X," "Y," "N," "WI," "A," "B," "C," "D," etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory banks) can refer to one or more memory banks, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to." The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 150 may reference element "50" in FIG. 1, and a similar element may be referenced as 250 in FIG. 2. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a block diagram of an apparatus in the form of a computing system 100 including a memory device 120 in accordance with a number of embodiments of the present disclosure. As used herein, a memory device 120, controller 140, channel controller 143, memory bank 121, memory array 130, sensing circuitry 150, and/or a number of extended row address (XRA) components 170 might also be separately considered an "apparatus."

Figure 2:
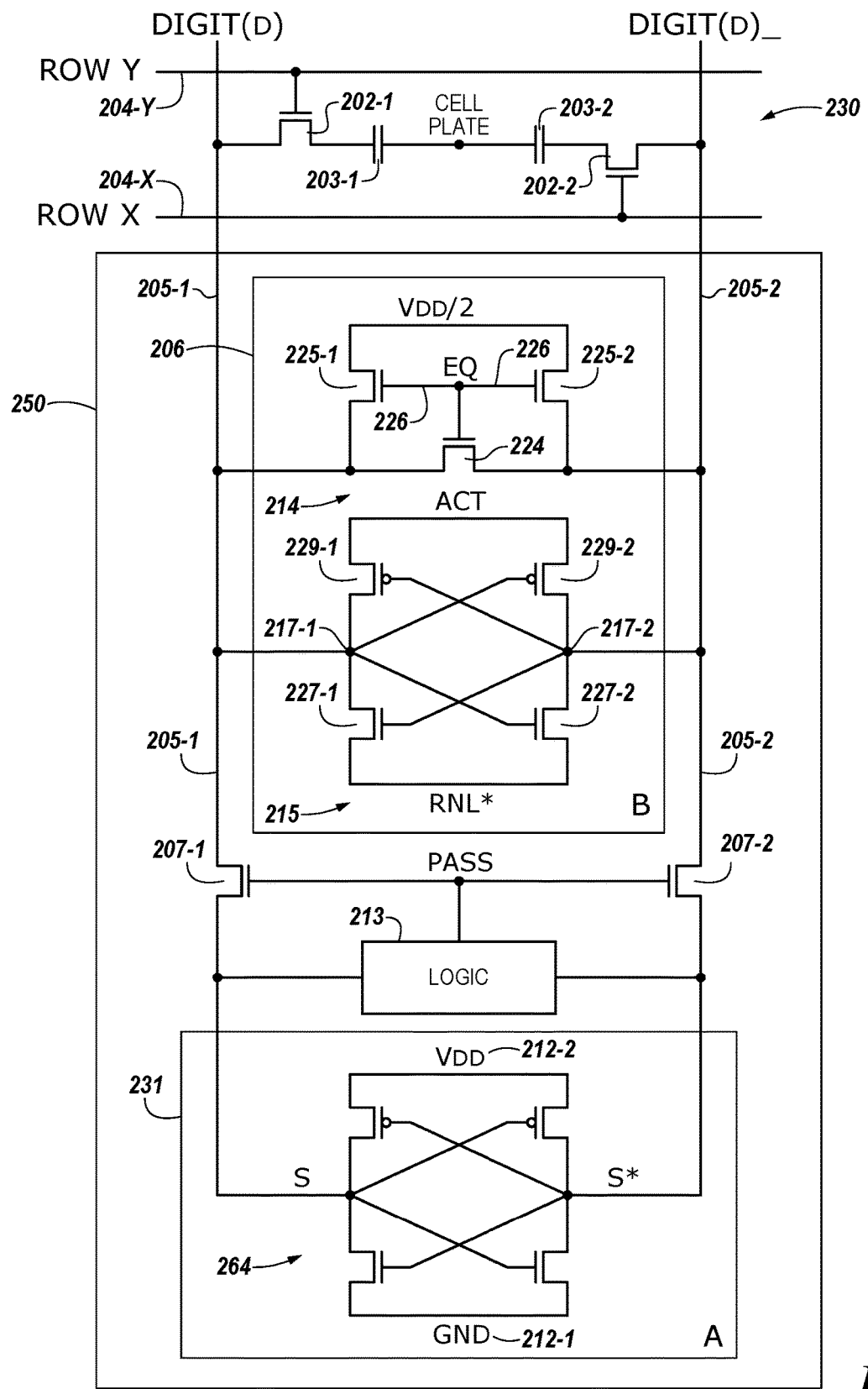
FIG. 2 is a schematic diagram illustrating sensing circuitry of a memory device in accordance with a number of embodiments of the present disclosure.
Figure 3:
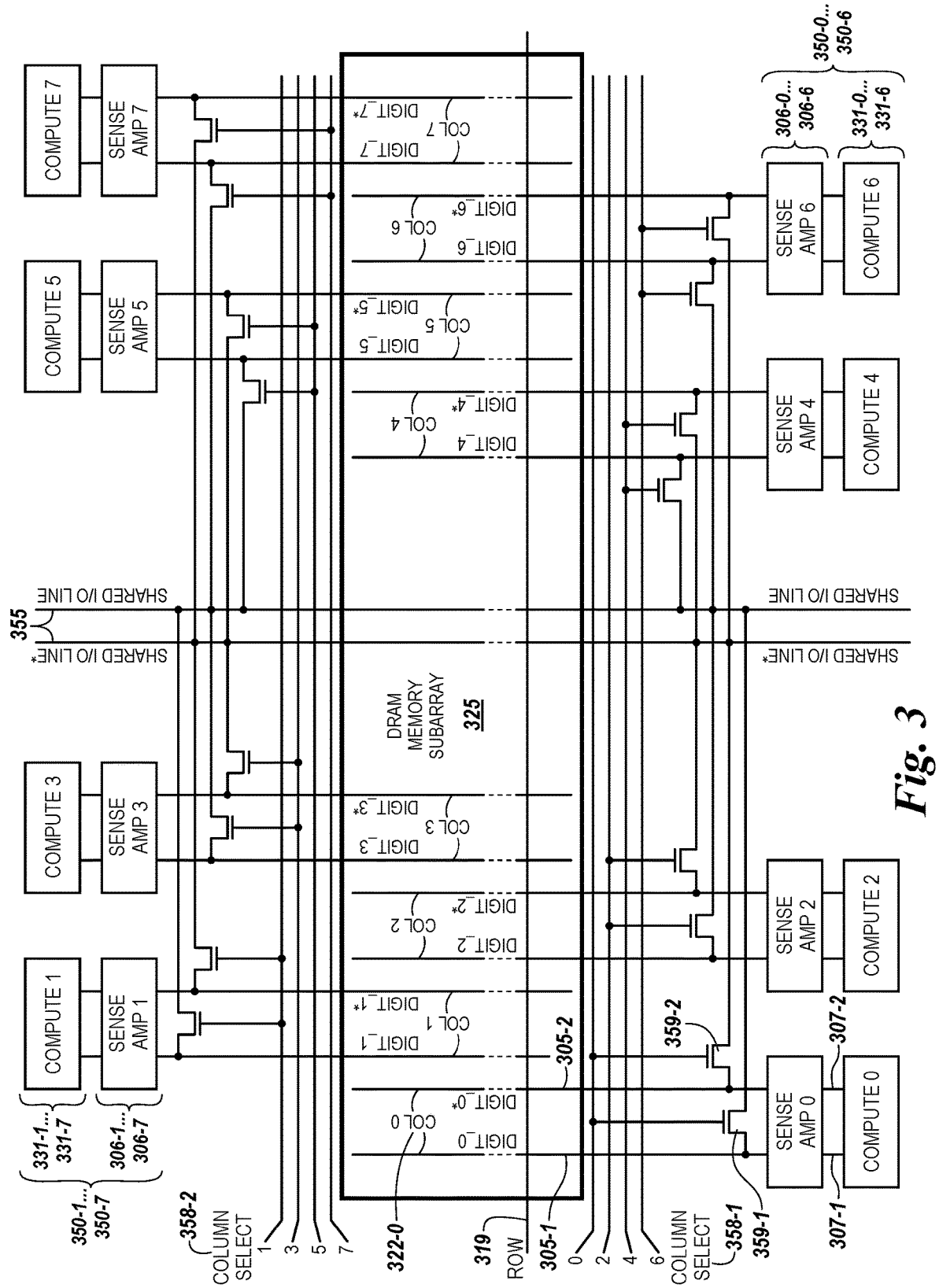
FIG. 3 is a schematic diagram illustrating circuitry for memory bank processing in accordance with a number of embodiments of the present disclosure.

As used herein, the XRA components 170 are intended to provide additional functionalities (e.g., peripheral amplifiers) that sense (e.g., read, store, cache) data values of memory cells in an array and that are distinct from the sense amplifiers of the sensing component stripes described herein (e.g., as shown at 206 in FIG. 2 and at corresponding reference number in FIG. 3). The XRA components 170 can include latches and/or registers. For example, additional latches can be included in an "XRA component 170." The latches of the XRA component 170 can be located on a periphery of a bank 121 of the memory device. In contrast, the sense amplifiers located in a plurality of sensing component stripes may be physically associated with each subarray of memory cells in the bank.

System 100 in FIG. 1 includes a host 110 coupled (e.g., connected) to memory device 120, which includes a memory bank 121 that includes a memory array 130. Host 110 can be a host system such as a personal laptop computer, a desktop computer, a digital camera, a smart phone, a memory card reader, and/or internet-of-thing enabled device, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

The memory bank 121 can be a portion of the memory device 120 that includes a memory array 130. For example, the memory bank 121 can include multiple rows and columns of storage units and be located on a single chip or spread across multiple chips of the memory device 120. In some embodiments, each memory bank 121 can be addressed separately, for example, by the controller 140. Although illustrated in FIG. 1 as a single memory bank, the memory bank 121 may be one of multiple memory banks as shown in more detail in FIGS. 4A-4C, herein. Further, as described in more detail in connection with FIGS. 4A-4C, herein, the memory banks (e.g., memory banks 421-0, . . . , 421-7) can include a system processor to control and/or orchestrate performance of memory operations and/or a bank processor to perform memory operations in response to instructions received from the system processor.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, among other types of arrays. The array 130 can include memory cells arranged in rows coupled by access lines (which may be referred to herein as word lines or select lines) and columns coupled by sense lines (which may be referred to herein as data lines or digit lines). Although a single array 130 is shown in FIG. 1, embodiments are not so limited. For instance, memory device 120 may include a number of arrays 130 (e.g., a number of banks of DRAM cells, NAND flash cells, etc.).

The memory device 120 can include address circuitry 142 to latch address signals provided over a combined data/address bus 156 (e.g., an external I/O bus connected to the host 110) by I/O circuitry 144, which can comprise an internal I/O bus. The internal I/O bus can transfer data between memory banks and I/O pins (e.g., DRAM DQs), for example. In some embodiments, the internal I/O bus may be configured to transfer data between the memory banks and I/O pins concurrently with the BBT bus transferring data between the memory banks.

Status and exception information can be provided from the controller 140 of the memory device 120 to a channel controller 143, for example, through an out-of-band (OOB) bus 157, which in turn can be provided from the channel controller 143 to the host 110. The channel controller 143 can include a logic component 160 to allocate a plurality of locations (e.g., controllers for subarrays) in the arrays of each respective bank to store bank commands, application instructions (e.g., for sequences of operations), and arguments (e.g., PIM commands) for the various banks associated with operations of each of a plurality of memory devices. The channel controller 143 can send commands (e.g., PIM commands) to the plurality of memory devices 120-1, . . . , 120-N to store those program instructions within a given bank of a memory device. As used herein, "PIM commands" are commands executed by processing elements within a memory bank (e.g., via sensing circuitry 150), as opposed to normal DRAM commands (e.g., read/write commands) that result in data being operated on by an external processing component such as the host 110.

Address signals are received through address circuitry 142 and decoded by a row decoder 146 and a column decoder 152 to access the memory array 130. Data can be sensed (read) from memory array 130 by sensing voltage and/or current changes on sense lines (digit lines) using a number of sense amplifiers, as described herein, of the sensing circuitry 150. A sense amplifier can read and latch a page (e.g., a row) of data from the memory array 130. Additional compute circuitry, as described herein, can be coupled to the sensing circuitry 150 and can be used in combination with the sense amplifiers to sense, store (e.g., cache and/or buffer), perform compute functions (e.g., operations), and/or move data. The I/O circuitry 144 can be used for bi-directional data communication with host 110 over the data bus 156 (e.g., a 64 bit wide data bus). The write circuitry 148 can be used to write data to the memory array 130.

Controller 140 (e.g., bank control logic and sequencer) can decode signals (e.g., commands) provided by control bus 154 from the host 110. These signals can include chip enable signals, write enable signals, and/or address latch signals that can be used to control operations performed on the memory array 130, including data sense, data store, data movement (e.g., copying, transferring, and/or transporting data values), data write, and/or data erase operations, among other operations. In various embodiments, the controller 140 can be responsible for executing instructions from the host 110 and accessing the memory array 130. The controller 140 can be a state machine, a sequencer, or some other type of controller.

Examples of the sensing circuitry 150 are described further below (e.g., in FIGS. 2, 3, and 6). For instance, in a number of embodiments, the sensing circuitry 150 can include a number of sensing components (e.g., a number of sense amplifiers and compute components), which may serve as an accumulator and can be used to perform operations in each subarray (e.g., on data associated with complementary sense lines).

In a number of embodiments, the sensing circuitry 150 can be used to perform operations using data stored in memory array 130 as inputs and participate in movement of the data for copy, transfer, writing, logic, and/or storage operations to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and/or other processing circuitry, such as ALU circuitry, located on memory device 120, such as on controller 140 or elsewhere).

In various previous approaches, data associated with an operand, for instance, would be read from memory via sensing circuitry and provided to external ALU circuitry via I/O lines (e.g., via local I/O lines and/or global I/O lines) and/or an external data bus. The external ALU circuitry could include a number of registers and would perform compute functions using the operands, and the result would be transferred back to the array via the I/O lines. In contrast, in a number of embodiments of the present disclosure, sensing circuitry 150 is configured to perform operations on data stored in memory array 130 and store the result back to the memory array 130 without enabling an I/O line (e.g., a local I/O line) coupled to the sensing circuitry 150. In various embodiments, methods, and apparatuses are provided which can function as a PIM RAM. As used herein, "PIM RAM" refers to random access memory in which operations may be performed without transferring the data on which the operations are to be performed to an external location such as a host processor via an external bus (e.g., bus 156). In PIM RAM operation it is useful to transfer data between banks without using a data bus external to the die. The sensing circuitry 150 can be formed on a same pitch as sense lines of the array. The XRA component 170 can include latches and/or registers, as described herein, and can be coupled to the sensing circuitry 150 via a shared I/O line, but can be distinct from the sensing circuitry 150.

In a number of embodiments, circuitry external to array 130 and sensing circuitry 150 is not needed to perform compute functions as the sensing circuitry 150 can be controlled to perform the appropriate operations associated with such compute functions without the use of an external processing resource. In some embodiments, sensing components can serve as 1-bit processing elements on a per column basis. Therefore, the sensing circuitry 150 may be used to complement or to replace, at least to some extent, such an external processing resource (or at least the bandwidth consumption of such an external processing resource).

However, in a number of embodiments, the sensing circuitry 150 may be used to perform operations (e.g., to execute instructions) in addition to operations performed by an external processing resource (e.g., host 110). For instance, host 110 and/or sensing circuitry 150 may be limited to performing only certain operations and/or a certain number of operations.

Enabling an I/O line can include enabling (e.g., turning on, activating) a transistor having a gate coupled to a decode signal (e.g., a column decode signal) and a source/drain coupled to the I/O line. However, embodiments are not limited to not enabling an I/O line. For instance, in a number of embodiments, the sensing circuitry 150 can be used to perform operations without enabling column decode lines of the array; however, the local I/O line(s) may be enabled in order to transfer a result to a suitable location other than back to the array 130, for example, to an external register. Enabling (e.g., firing) a DQ pin can similarly consume significant power and time (e.g., require additional clock cycles (tck) for data transfers).

FIG. 2 is a schematic diagram illustrating sensing circuitry 250 in accordance with a number of embodiments of the present disclosure. The sensing circuitry 250 can correspond to sensing circuitry 150 shown in FIG. 1.

A memory cell can include a storage element (e.g., capacitor) and an access device (e.g., transistor). For instance, a first memory cell can include transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

The cells of the memory array 230 can be arranged in rows coupled by access (word) lines 204-X (Row X), 204-Y (Row Y), etc., and columns coupled by pairs of complementary sense lines (e.g., digit lines DIGIT(D) and DIGIT (D)_ shown in FIG. 2 and DIGIT_0 and DIGIT_0* shown in FIG. 3). The individual sense lines corresponding to each pair of complementary sense lines can also be referred to as digit lines 205-1 for DIGIT (D) and 205-2 for DIGIT (D)_, respectively, or corresponding reference numbers in FIG. 3. Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Although rows and columns are illustrated as orthogonally oriented in a plane, embodiments are not so limited. For example, the rows and columns may be oriented relative to each other in any feasible three-dimensional configuration. For example, the rows and columns may be oriented at any angle relative to each other, may be oriented in a substantially horizontal plane or a substantially vertical plane, and/or may be oriented in a folded topology, among other possible three-dimensional configurations.

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The memory array 230 is configured to couple to sensing circuitry 250 in accordance with a number of embodiments of the present disclosure. In this embodiment, the sensing circuitry 250 comprises a sense amplifier 206 and a compute component 231 corresponding to respective columns of memory cells (e.g., coupled to respective pairs of complementary digit lines). The sense amplifier 206 can be coupled to the pair of complementary digit lines 205-1 and 205-2. The compute component 231 can be coupled to the sense amplifier 206 via pass gates 207-1 and 207-2. The gates of the pass gates 207-1 and 207-2 can be coupled to operation selection logic 213.

The operation selection logic 213 can be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The operation selection logic 213 can also be coupled to the pair of complementary digit lines 205-1 and 205-2. The operation selection logic 213 can be configured to control pass gates 207-1 and 207-2 based on a selected operation.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary digit lines (D) 205-1 and (D)_ 205-2. However, embodiments are not limited to this example. The latch 215 can be a cross coupled latch (e.g., gates of a pair of transistors) such as n-channel transistors (e.g., NMOS transistors) 227-1 and 227-2 are cross coupled with the gates of another pair of transistors, such as p-channel transistors (e.g., PMOS transistors) 229-1 and 229-2).

In operation, when a memory cell is being sensed (e.g., read), the voltage on one of the digit lines 205-1 (D) or 205-2 (D)_ will be slightly greater than the voltage on the other one of digit lines 205-1 (D) or 205-2 (D)_. An ACT signal and an RNL* signal can be driven low to enable (e.g., fire) the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage $V_{DD}$ through a source transistor, and the other digit line 205-1 (D) or 205-2 (D)_ is driven to the voltage of the reference voltage (e.g., ground) through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell.

Embodiments are not limited to the sense amplifier 206 configuration illustrated in FIG. 2. As an example, the sense amplifier 206 can be a current-mode sense amplifier and a single-ended sense amplifier (e.g., sense amplifier coupled to one digit line). Also, embodiments of the present disclosure are not limited to a folded digit line architecture such as that shown in FIG. 2.

The sense amplifier 206 can, in conjunction with the compute component 231, be operated to perform various operations using data from an array as input. In a number of embodiments, the result of an operation can be stored back to the array without transferring the data via a digit line address access and/or moved between banks without using an external data bus (e.g., without firing a column decode signal such that data is transferred to circuitry external from the array and sensing circuitry via local I/O lines). As such, a number of embodiments of the present disclosure can enable performing operations and compute functions associated therewith using less power than various previous approaches. Additionally, since a number of embodiments provide an ability to transfer data bank to bank without the need to transfer data across local and/or global I/O lines and/or external data buses, a number of embodiments can enable an improved processing capability as compared to previous approaches.

The sense amplifier 206 can further include equilibration circuitry 214, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ enables the transistors 224, 225-1, and 225-2, which effectively shorts digit lines 205-1 (D) and 205-2 (D)_ together and to the equilibration voltage (e.g., $V_{DD}/2$).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As shown in FIG. 2, the compute component 231 can also comprise a latch, which can be referred to herein as a secondary latch 264. The secondary latch 264 can be configured and operated in a manner similar to that described above with respect to the primary latch 215. In this example, the pair of cross coupled p-channel transistors (e.g., PMOS transistors) included in the secondary latch have their respective sources coupled to a supply voltage 212-2 (e.g., $V_{DD}$), and the pair of cross coupled n-channel transistors (e.g., NMOS transistors) of the secondary latch have their respective sources selectively coupled to a reference voltage 212-1 (e.g., ground), such that the secondary latch is continuously enabled. The configuration of the compute component 231 is not limited to that shown in FIG. 2, and various other embodiments are feasible.

FIG. 3 is a schematic diagram illustrating circuitry for data transfer in a memory device in accordance with a number of embodiments of the present disclosure. FIG. 3 shows eight sense amplifiers (e.g., sense amplifiers 0, 1, . . . , 7 shown at 306-0, 306-1, . . . , 306-7, respectively) each coupled to a respective pair of complementary sense lines (e.g., digit lines 305-1 and 305-2). FIG. 3 also shows eight compute components (e.g., compute components 0, 1, . . . , 7 shown at 331-0, 331-1, . . . , 331-7) each coupled to a respective sense amplifier (e.g., as shown for sense amplifier 0 at 306-0) via respective pass gates 307-1 and 307-2 and digit lines 305-1 and 305-2. For example, the pass gates can be connected as shown in FIG. 2 and can be controlled by an operation selection signal, Pass. For example, an output of the selection logic can be coupled to the gates of the pass gates 307-1 and 307-2 and digit lines 305-1 and 305-2. Corresponding pairs of the sense amplifiers and compute components can contribute to formation of the sensing circuitry indicated at 350-0, 350-1, . . . , 350-7.

The sense amplifiers 306-0, 306-1, . . . , 306-7 in FIG. 3 can each correspond to sense amplifier 206 shown in FIG. 2. The compute components 331-0, 331-1, . . . , 331-7 shown in FIG. 3 can each correspond to compute component 231 shown in FIG. 2. A combination of one sense amplifier with one compute component can contribute to the sensing circuitry (e.g., 350-0, 350-1, . . . , 350-7) of a portion of a DRAM memory subarray 325 configured to a shared I/O (SIO) line 355 shared by a number of sensing component stripes for subarrays and/or latch components, as described herein. The paired combinations of the sense amplifiers 306-0, 306-1, . . . , 306-7 and the compute components 331-0, 331-1, . . . , 331-7, shown in FIG. 3, can be included in the sensing component stripe. In some embodiments, data can be transferred via the SIO lines 355 between a subarray and/or a bank and the BBT bus.

The memory device can include a number of sensing component stripes configured to include a number of a plurality of sense amplifiers and compute components (e.g., 306-0, 306-1, . . . , 306-7 and 331-0, 331-1, . . . , 331-7, respectively, as shown in FIG. 3) that can correspond to a number of the plurality of columns (e.g., 305-1 and 305-2 in FIG. 3) of the memory cells, where the number of sense amplifiers and/or compute components can be selectably coupled to the plurality of SIO lines (e.g., via column select circuitry 358-1 and 358-2). The column select circuitry can be configured to selectably sense data in a particular column of memory cells of a subarray by being selectably coupled to a plurality of (e.g., four, eight, and sixteen, among other possibilities) sense amplifiers and/or compute components.

The circuitry illustrated in FIG. 3 also shows column select circuitry 358-1 and 358-2 that is configured to implement data movement operations with respect to particular columns 322 of a subarray 325, the complementary digit lines 305-1 and 305-2 associated therewith, and the shared I/O line 355 (e.g., as directed by the controller 140 shown in FIG. 1). For example, column select circuitry 358-1 has select lines 0, 2, 4, and 6 that are configured to couple with corresponding columns, such as column 0 (332-0), column 2, column 4, and column 6. Column select circuitry 358-2 has select lines 1, 3, 5, and 7 that are configured to couple with corresponding columns, such as column 1, column 3, column 5, and column 7. In a number of embodiments, by operating the SIO line 355, data values may be transferred between memory banks via the BBT bus, as described in more detail in connection with FIGS. 4A-4D, herein.

For example, as described herein, the array of memory cells can include an implementation of DRAM memory cells where the controller is configured, in response to a command, to move (e.g., copy, transfer, and/or transport) data from the source location to the destination location via a shared I/O line. In various embodiments, the source location can be in a first bank and the destination location can be in a second bank in the memory device and/or the source location can be in a first subarray of one bank in the memory device and the destination location can be in a second subarray of a different bank. According to embodiments, the data can be moved as described in connection with FIGS. 4A-4D. The first subarray and the second subarray can be in the same section of a bank or the subarrays can be in different sections of the bank.

While example embodiments including various combinations and configurations of sensing circuitry, sense amplifiers, compute components, sensing component stripes, shared I/O lines, column select circuitry, multiplexers, latch components, latch stripes, and/or latches, etc., have been illustrated and described herein, embodiments of the present disclosure are not limited to those combinations explicitly recited herein. Other combinations and configurations of the sensing circuitry, sense amplifiers, compute components, sensing component stripes, shared I/O lines, column select circuitry, multiplexers, latch components, latch stripes, and/ or latches, etc., disclosed herein are expressly included within the scope of this disclosure.

Figure 4A:
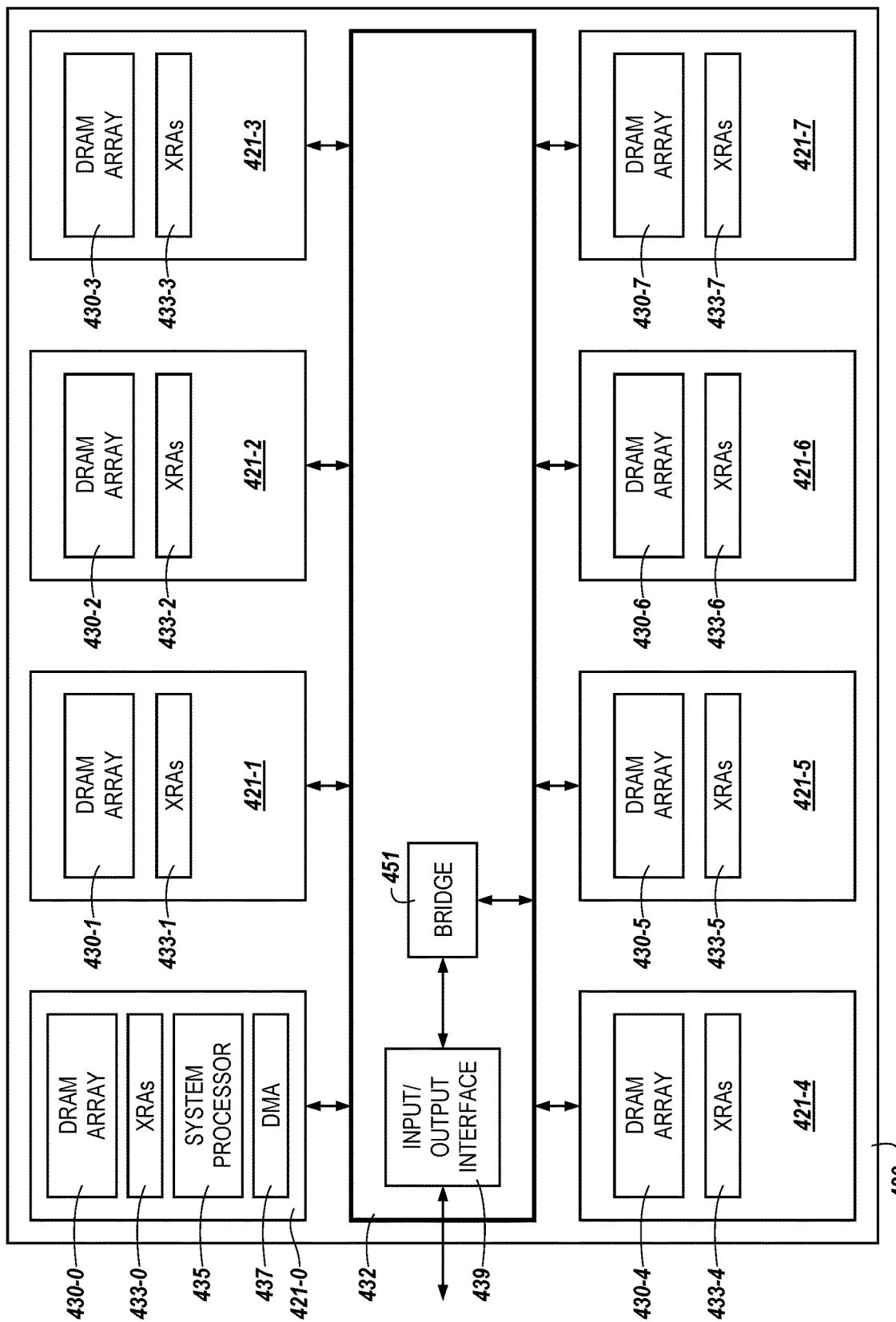
FIG. 4A is block diagram illustrating a number of banks of a memory device in accordance with a number of embodiments of the present disclosure.

FIG. 4A is block diagram illustrating a number of banks of a memory device in accordance with a number of embodiments of the present disclosure. As shown in FIG. 4A, the memory device 420 includes a plurality of banks 421-0, . . . , 421-7, an input/output interface 439, and/or a bridge 451. The plurality of banks 421-0, . . . , 421-7 may each include a dynamic random-access memory (DRAM) array 430-0, . . . , 430-7. The plurality of banks 421-0, . . . , 421-7 may each be coupled to a bank-to-bank transfer bus 432, which may provide a data path over which data may be transferred between the plurality of banks 421-0, . . . , 421-7. In some embodiments, the memory device 420 can be a DRAM memory device that is resident (e.g., included as part of, or is) a dual inline memory module (DIMM), such as an NV-DIMM, or other DIMM.

In some embodiments, the plurality of banks 421-0, . . . , 421-7 can comprise volatile and/or non-volatile memory. For example, the plurality of banks 421-0, . . . , 421-7 can include dynamic random-access memory such as DRAM arrays 433-0, . . . , 433-7. In embodiments in which the plurality of banks 421-0, . . . , 421-7 include volatile memory portions such as the DRAM arrays 433-0, . . . , 433-7, the input/output interface 439 can be configured to interface (e.g., couple) to an external non-volatile memory device (not explicitly shown in FIGS. 4A-4C). This may allow for data stored in the DRAM arrays 433-0, . . . , 433-7 to be transferred to a non-volatile memory device such as a solid-state drive, hard disk drive, flash drive, etc. to preserve the data in the absence of a power source. For example, the input/output interface 439 can allow a connection to made between the memory device 420 and an external, non-volatile memory device to transfer data between the memory device 420 and the external non-volatile memory device.

The DRAM array(s) 430-0, . . . , 430-7 can be provided such that they do not include a double data rate (DDR) interface. For example, since the system processor 435 can be configured to control operation of the memory device 420 without transferring data and/or commands to a device (e.g., a host computing device, etc.) external to the memory device 420, the DRAM array(s) 430-0, ..., 430-N need not include a DDR interface to send and/or receive commands from a device external to the memory device 420 in some embodiments. Instead, in some embodiments, the DRAM array(s) 430-0, ..., 430-7 can send and/or receive commands directly from the system processor 435, as described herein.

The memory banks 421-0, ..., 421-7 can include circuitry to perform processing-in-memory (PIM) operations. For example, the DRAM arrays 430-0, ..., 430-7 can include circuitry to perform PIM operations. In such embodiments, the DRAM arrays 430-0, ..., 430-7 can include circuitry described in connection with FIGS. 2, 3, 6, and 7 to perform memory operations, such as logical operations, on data (e.g., operands) stored in the DRAM arrays 430-0, ..., 430-7 without transferring the data via the input/output interface 439 to circuitry, such as a host, external to the memory device 420.

However, in at least one embodiment, at least one of the memory banks 421-0, ..., 421-7 may not include circuitry configured to perfume PIM operations. For example, the memory bank 421-0 that includes the system processor 435 may not include circuitry configured to perform PIM operations, while the memory banks 421-1, ..., 421-7 that do not include the system processor 435 may include circuitry configured to perform PIM operations. Embodiments are not so limited, however, and various combinations of memory banks 421-0, ..., 421-7 may include, or be devoid of, the circuitry configured to perform PIM operations.

In embodiments in which the memory bank 421-0 that includes the system processor 435 does not include circuitry configured to perform PIM operations and the memory banks 421-1, ..., 421-7 that do not include the system processor 435 include circuitry configured to perform PIM operations, the system processor 435 may orchestrate or control performance of those operations by controlling operations of the memory banks 421-1, ..., 421-7. By not including circuitry configured to perform PIM operations on the memory bank 421-0 that includes the system processor 435, it may be possible to achieve uniform size among the memory banks 421-0, ..., 421-7, which may result in a simpler fabrication process than examples in which each memory bank 421-0, ..., 421-7 includes the circuitry configured to perform the PIM operations.

In some embodiments, one bank (e.g., bank 421-0) may include a system processor 435 and/or a direct media access (DMA) component 437. As described above, the system processor 435 can provide the functionality typically provided by an external device such as a host computing device. Accordingly, in some embodiments, the memory device 420 can operate in the absence of instructions and/or applications provided by a host computing device because the system processor 435 can provide those same (or similar) instructions and/or applications.

The DMA component 437 can provide vectored input/output (e.g., scatter/gather I/O) processes to the memory device 420. The system processor 435 may be configured to control operations, such as data transfer between the banks 421-0, ..., 421-7, data transfer to and/or from the memory device 420 to devices coupleable to the memory device 420, etc., for the memory device 420. For example, the system processor 435 deployed on bank 421-0 may be configured to control transfer of data between the banks 421-0, ..., 421-7 via the bank-to-bank transfer bus 432. In some embodiments, the bank-to-bank transfer bus 432 can include, for example, a ring, cross-bar, or on chip network configuration. The bank (e.g., bank 421-0) that includes the system processor 435 may further include extended row address (XRA) components 433-0 as described in more detail in connection with FIG. 5, herein.

The system processor 435 may be a reduced instruction set computer (RISC) such as a RISC-V application processor. Accordingly, the system processor 435 may be configured to operate using fewer cycles per instruction than processors utilized for memory device control that include complex instruction set computers as in some other approaches. Further, by including the system processor 435 on one memory bank (e.g., bank 421-0) of the memory device 420, a tighter coupling to the DRAM arrays (e.g., DRAM arrays 430-0, ..., 430-7) of the banks 421-0, ..., 421-7 than some approaches in which memory device processing is performed either external to the memory device 420 or by a single bank processor coupled to each bank 421-0, ..., 421-7 of the memory device. In addition, this can allow for the system processor 435 to experience a tight coupling to the resources of the bank (e.g., bank 421-0) on which the system processor 435 is resident, which can alleviate a need for instruction and data caches that are not associated with a particular bank 421-0, ..., 421-7, thereby preserving the structure of the memory device 420.

In some embodiments, the system processor 435 can execute instructions and/or programs to control performance of memory operations for the memory device 420. For example, the system processor 435 can receive commands (e.g., from the input/output interface 439 and/or the banks 421-1, ..., 421-7) to cause the system processor 435 to execute instructions to cause performance of memory operations for the banks 421-1, ..., 421-7 and/or the memory device 420. Stated alternatively, the system processor 435 can respond to information and/or data received from an interface, such as the input/output interface 439, and execute instructions to cause performance of compute (e.g., processing-in-memory) operations in the banks 421-1, ..., 421-7.

Examples of memory operations can include storage of data in the banks 421-0, ..., 421-7, performance of processing-in-memory (PIM) operations performed by the banks 421-0, ..., 421-7, transfer of data within the banks 421-1, ..., 421-7, transfer of data between the banks 421-1, ..., 421-7, etc. Examples of PIM operations can include compute operations such as logical operations performed between operands stored in the banks 421-1, ..., 421-7. In some embodiments, the system processor 435 can perform various control operations for the memory device 420 while farming out other memory operations to the banks 421-1, ..., 421-7). Information regarding the operations performed by the banks 421-1, ..., 421-7 can be returned to the system processor 435 as part of execution of the instructions and/or program(s) by the system processor 435.

Figure 5:
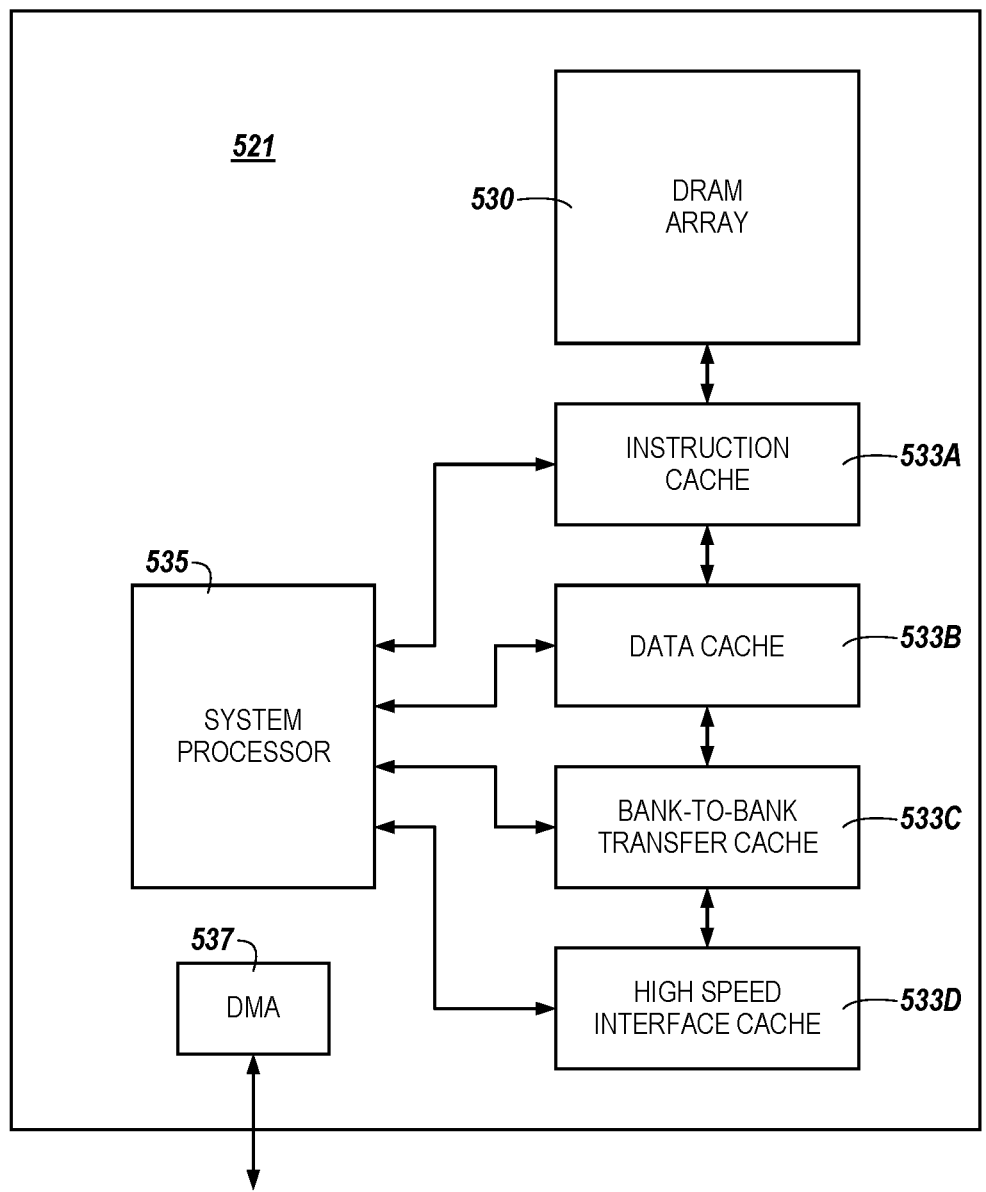
FIG. 5 is a block diagram illustrating a bank of a memory device including a memory system processor in accordance with a number of embodiments of the present disclosure.

As shown in FIG. 4A, the banks 421-0, ..., 421-7 may include one or more XRAs 433-0, ..., 433-7. The XRAs 433-0, ..., 433-7 may include latches and/or may be registers to store data corresponding to various operating parameters of the banks 421-0, ..., 421-7, as described in more detail in connection with FIG. 5, herein. In some embodiments, the banks 421-1, ..., 421-7 that do not include the system processor 435 may include more XRAs than the bank (e.g., bank 421-0) that includes the system processor 435. For example, bank 421-0 may include fewer XRAs 433-0 than banks 421-1, ..., 421-7. In a non-limiting example, bank 421-0 may include four XRAs 433-0, as shown in FIG. 5, while the other banks 421-1, ..., 421-7 may include more than four XRAs 433-1, ..., 433-7.

Figure 4B:
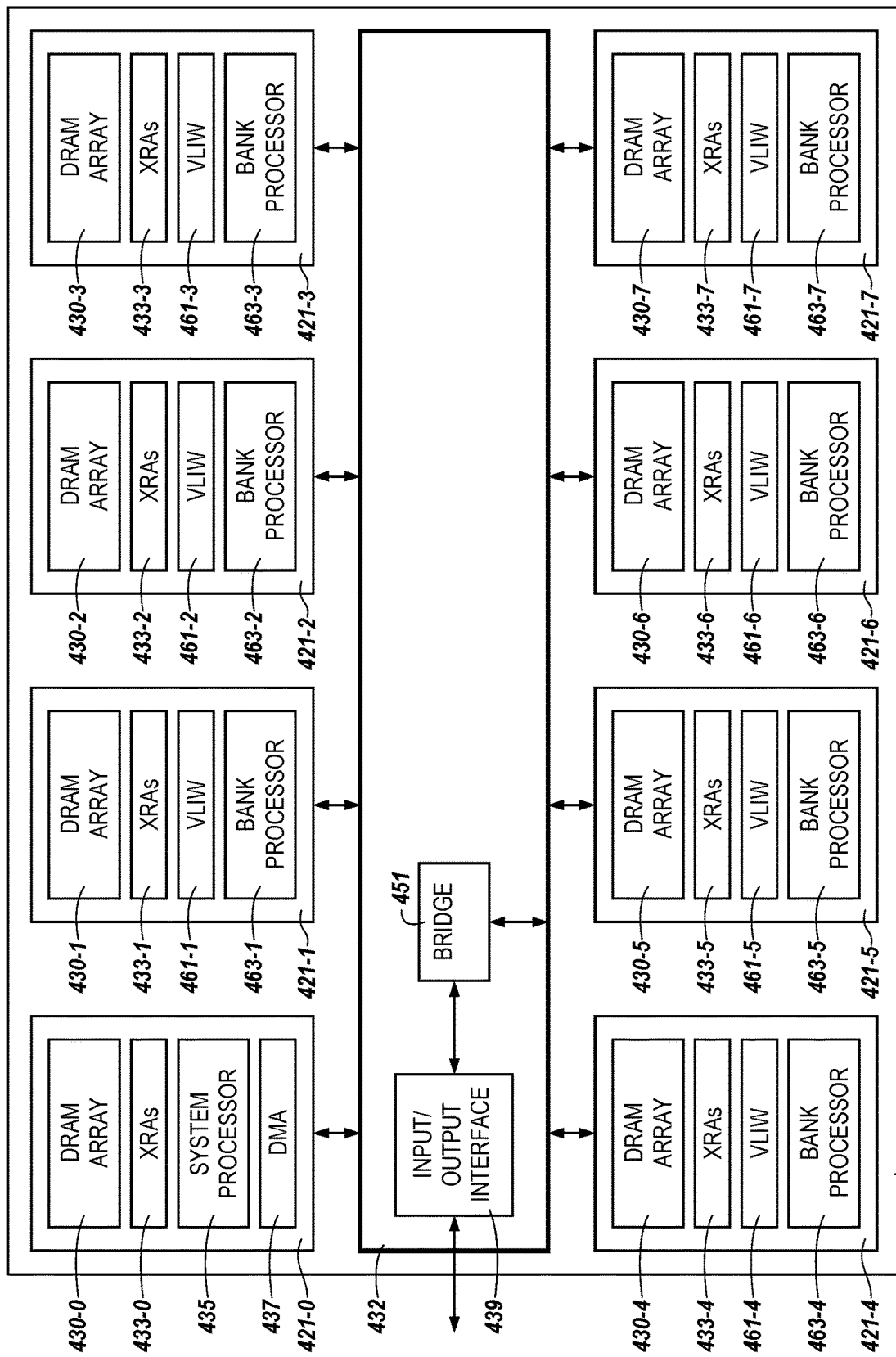
FIG. 4B is another block diagram illustrating a number of banks of a memory device in accordance with a number of embodiments of the present disclosure.

FIG. 4B is another block diagram illustrating a number of banks of a memory device in accordance with a number of embodiments of the present disclosure. The memory device 420 illustrated in FIG. 4B may be analogous to the memory device 420 illustrated in FIG. 4A, however, the banks 421-1, ..., 421-7 of the memory device 420 illustrated in FIG. 4B may further include respective very long instruction word (VLIW) machines 461-1, ..., 461-7 and/or respective bank processors 463-1, ..., 463-7. For example, bank 421-0 may not include a VLIW machine, while banks 421-1, ..., 421-7 may each include a respective VLIW machine 461-1, ..., 461-7.

The bank processors 463-1, ..., 463-7 may be RISC type processors in some embodiments. However, the bank processors 463-1, ..., 436-7 may be 32-bit processors while the system processor 435 included in bank 421-0 may be a 64-bit application processor. Accordingly, in some embodiments, the system processor 435 of bank 421-0 may be configured to handle a higher processing load to control memory operation of the memory device 420 than the bank processors 463-1, ..., 463-7 of the other banks 421-1, ..., 421-7.

In some embodiments, the bank processors 463-1, ..., 463-7 can include dedicated hardware configured to execute particular routines or sub-routines, such as library routines. The bank processors 463-1, ..., 463-7 can communicate with each to, for example, perform synchronization operations to synchronize performance of particular routines or sub-routines, however, in some embodiments, the bank processors 463-1, ..., 463-7 may not control performance of operations for each other, instead leaving the tasks of orchestrating the bank processors 463-1, ..., 463-7 to the system processor 435.

In a non-limiting example, the memory device 420 shown in FIGS. 4A and 4B can be deployed in an Internet of Things enabled device such as a security camera. In such an example, the camera (not shown in FIGS. 4A and 4B for clarity) can perform facial recognition tasks using the banks 421-0, ..., 421-7. Performance of facial recognition tasks can utilize a high volume of memory resources and/or bandwidth, especially in the context of a security camera that is constantly receiving large chunks of data in the form of video recordings.

By performing facial recognition on the large chunks of data using the memory device 420, relevant data (e.g., data that just pertains to facial recognition) may be extracted by the memory device 420, thereby decreasing the overall amount of data that can then be stored by the memory device 420 or transferred to an external location such as a host.

Figure 4C:
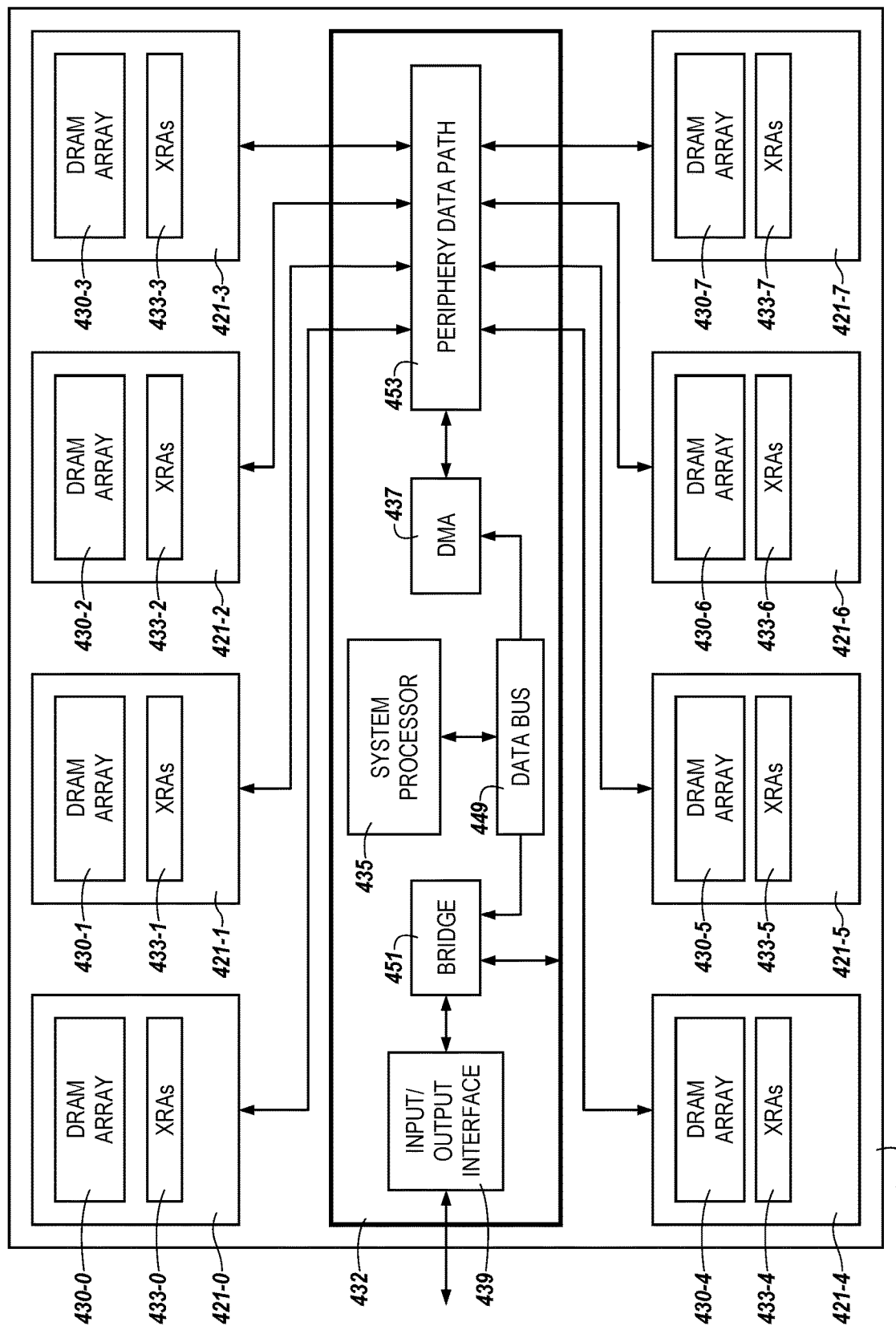
FIG. 4C is yet another block diagram illustrating a number of banks of a memory device in accordance with a number of embodiments of the present disclosure.

FIG. 4C is yet another block diagram illustrating a number of banks of a memory device in accordance with a number of embodiments of the present disclosure. As shown in FIG. 4C, the memory device 420 includes a plurality of banks 421-0, ..., 421-7, an input/output interface 439, a bridge 451, a data bus 449, a system processor 435, a direct memory access (DMA) component 437, and/or a periphery data path 453. The plurality of banks 421-0, ..., 421-7 may each include a dynamic random-access memory (DRAM) array 430-0, ..., 430-7, and a plurality of extended row address (XRA) components 433-0, ..., 433-7. The banks 421-0, ..., 421-7 may each include extended row address (XRA) components 433-0, ..., 433-N, which are described in more detail in connection with FIG. 5. herein.

The example illustrated in FIG. 4C is contrasted with the examples shown in FIGS. 4A and 4B inasmuch as the system processor 435 shown in FIG. 4C is resident (e.g., is deployed) on the memory device 420 (as opposed to a particular bank of the memory device 420 as shown in FIGS. 4A and 4B). Deployment of the system processor 435 on the memory device 420 as opposed to on a particular bank of the memory device 420 can lead to the inclusion of addition circuitry (e.g., a data bus 449, a direct memory access (DMA) component 437, a periphery data path 453, etc.) in comparison to the examples shown in FIGS. 4A and 4B.

However, despite the inclusion of additional circuitry, the memory device 420 illustrated in FIG. 4C can be configured to process data local to the memory device 420 at the direction of the system processor 435. For example, the memory device 420 shown in FIG. 4C can process data locally without transferring (or receiving) data from an external host device.

The system processor 435 may be a reduced instruction set computer (RISC) such as a RISC-V application processor. Accordingly, the system processor 435 may be configured to operate using fewer cycles per instruction than processors utilized for memory device control than complex instruction set computers utilized in some other approaches. By including a system processor to the memory device 420 (e.g., by including a system processor on the memory device 420), a tighter coupling to the banks 421-0, ..., 421-7 than some approaches in which processing and/or command execution for the memory device 420 is performed external to the memory device 420. In some embodiments, providing a system processor 435 to the memory device may reduce power consumption, time delays, and/or processing power consumed in memory device management in comparison to approaches that utilize out-of-band processing for the memory device 420.

In some embodiments, the plurality of banks 421-0, ..., 421-7 may be coupled to the bank-to-bank transfer bus 432 via the periphery data path 453. For example, the periphery data path 453 may be coupled to the bank-to-bank data bus 432, which may be further coupled to the plurality of banks 421-0, ..., 421-7. As used herein, a "periphery data path" can, for example, refer to logic and/or circuitry disposed in a peripheral location (e.g., in the periphery of the memory device 420) of the memory device 420 that may provide one or more paths over which data may be transferred to and/or from the memory device 420 and/or banks 421-0, ..., 421-7. In some examples, the peripheral data path 453 may include logic and/or circuitry to provide data path(s) between the DRAM arrays 430-0, ..., 430-7 of the banks 421-0, ..., 421-7 the bank-to-bank transfer bus 432, the DMA 437, the data bus 449, the application processor 435, the bridge 451, and/or the input/output interface 439.

FIG. 5 is a block diagram illustrating a bank of a memory device in accordance with a number of embodiments of the present disclosure. As shown in FIG. 5, the memory bank 521 includes a dynamic random-access memory (DRAM) array 530, an instruction cache 533A, a data cache 533B, a bank-to-bank transfer cache 533C, a high-speed interface 533D, a system processor 535, and a direct memory access (DMA) component 537. The memory bank 521 may be analogous to bank 421-0 illustrated in FIG. 4A and/or banks 421-0, ..., 421-7 illustrated in FIGS. 4B and 4C.

In some embodiments, the instruction cache 533A, the data cache 533B, the bank-to-bank transfer cache 533C, and/or the high-speed interface 533D may comprise a plurality of extended row address (XRA) components such as XRAs 433 illustrated in FIGS. 4A-4C, herein. Embodiments are not so limited, however, and the instruction cache 533A, the data cache 533B, the bank-to-bank transfer cache 533C, and/or the high-speed interface cache 533D may comprise registers. In some embodiments, the XRAs can have a same physical pitch (e.g., can be formed on a same pitch) as memory rows of the memory device, which may allow for cache line updates to performed in parallel.

The instruction cache 533A may be configured to store instructions for the system processor 535. For example, the instruction cache 533A may be configured to store RISC-V a set(s) of instructions that control operation of the system processor 535. In some embodiments, the instruction cache 533A may be a 16 KB cache (or register), however, embodiments are not limited to any particular cache size, provided the instruction cache 533A is large enough to store instructions for operation of the system processor 535.

The data cache 533B may be configured to store data associated with the system processor 535. For example, the data cache 533B may be configured to store RISC-V data that are associated with operation of the system processor 535. In some embodiments, the data cache 533B may be a 16 KB cache (or register), however, embodiments are not limited to any particular cache size, provided the data cache 533B is large enough to store instructions for operation of the system processor 535.

The bank-to-bank transfer cache 533C may be configured to store instructions corresponding to control of data transfer operations between the memory banks (e.g., banks 421-0, . . . , 421-7 illustrated in FIGS. 4A-4C, herein). For example, the bank-to-bank transfer cache 533C may be configured to store instructions that may be used by the system processor 535 to cause data to be transferred from one of the banks to a different one of the banks (e.g., from a DRAM array of one of the banks to a DRAM array of a different one of the banks.

The high-speed interface cache 533D may be configured to cause data to be transferred into and/or or out of the bank 521 via the DMA 537. The high-speed interface cache 533D may be configurable to operate according to a variety of input/output protocols to transfer data into and/or out of the bank 521.

As described above, a bank 521 having the architecture shown in FIG. 5 may include fewer XRAs 533A to 533D than other banks of a memory device (e.g., memory device 420 illustrated in FIGS. 4A-4C, herein). Accordingly, in some embodiments, the bank 521 may feature a simplified XRA configuration as compared to some of the other banks of the memory device shown in FIGS. 4A-4C, herein.

Although not explicitly shown in FIG. 5, the bank 521 may include additional circuitry to control operation of the bank 521 and/or other memory banks (e.g., banks 421-1, . . . , 421-7 shown in FIG. 4A, for example). For example, the bank 521 may include various buses, timing circuitry, RAS chain control components, and/or cache control components to provide the necessary timing and control functionality to the bank 521.

Figure 6:
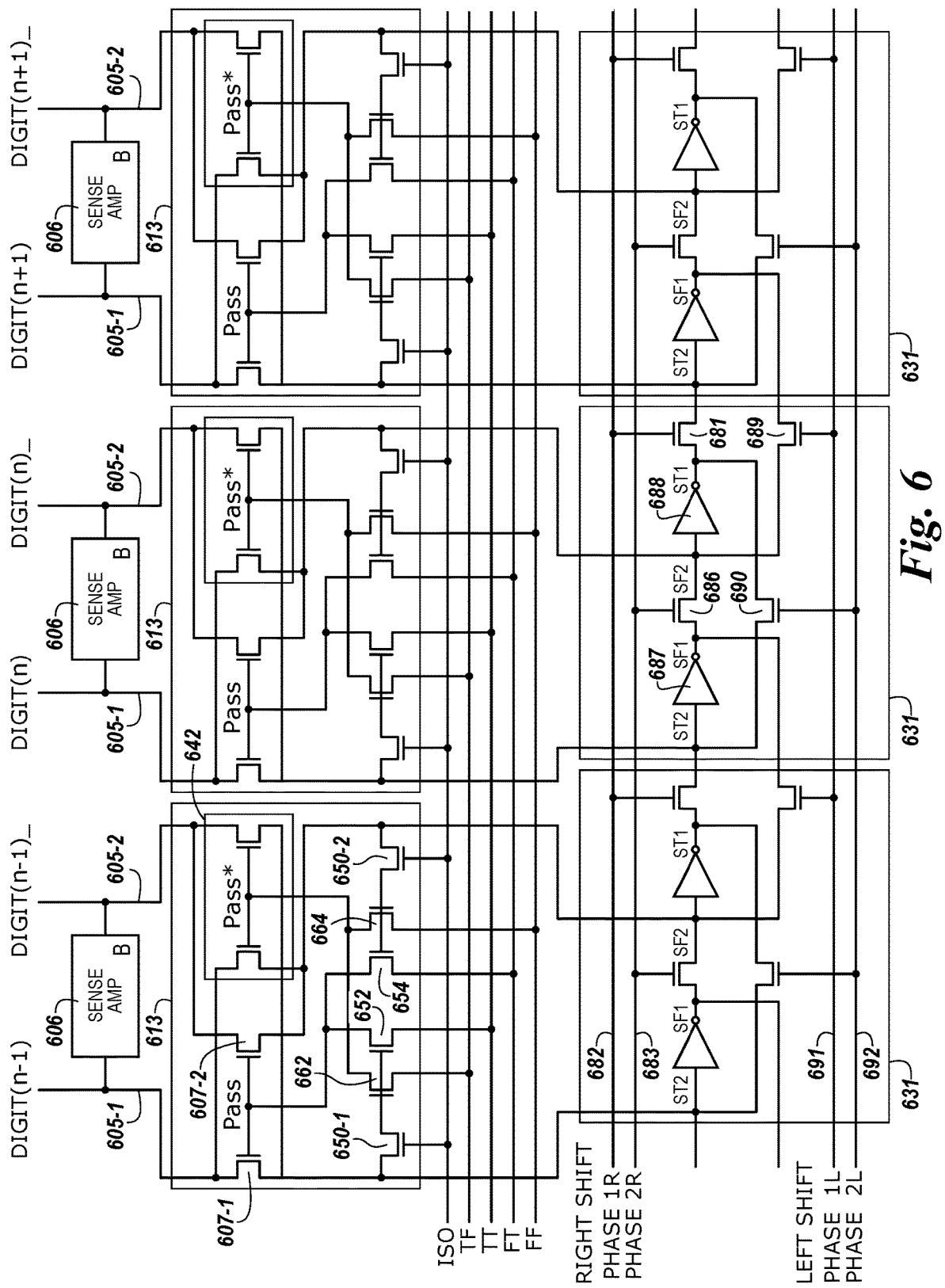
FIG. 6 is a schematic diagram illustrating sensing circuitry capable of implementing logical operations in accordance with a number of embodiments of the present disclosure.

FIG. 6 is a schematic diagram illustrating sensing circuitry capable of implementing logical operations in accordance with a number of embodiments of the present disclosure. FIG. 6 shows a sense amplifier 606 coupled to a pair of complementary sense lines 605-1 and 605-2, logical operation select logic 613, and a compute component 631 coupled to the sense amplifier 606 via pass gates 607-1 and 607-2. The sense amplifier 606 shown in FIG. 6 can correspond to sense amplifier 206 shown in FIG. 2. The compute component 631 shown in FIG. 6 can correspond to sensing circuitry, including compute component, 150 in FIG. 1. The logical operation selection logic 613 shown in FIG. 6 can correspond to logical operation selection logic 213 shown in FIG. 2. The gates of the pass gates 607-1 and 607-2 can be controlled by a logical operation selection logic 613 signal, (e.g., Pass). For example, an output of the logical operation selection logic 613 can be coupled to the gates of the pass gates 607-1 and 607-2. Further, the compute component 631 can comprise a loadable shift register configured to shift data values left and right.

According to the embodiment illustrated in FIG. 6, the compute components 631 can comprise respective stages (e.g., shift cells) of a loadable shift register configured to shift data values left and right. For example, as illustrated in FIG. 6, each compute component 631 (e.g., stage) of the shift register comprises a pair of right-shift transistors 681 and 686, a pair of left-shift transistors 689 and 690, and a pair of inverters 687 and 688. The signals PHASE 1R, PHASE 2R, PHASE 1L, and PHASE 2L can be applied to respective control lines 682, 683, 691 and 692 to enable/disable feedback on the latches of the corresponding compute components 631 in association with performing logical operations and/or shifting data in accordance with embodiments described herein.

The sensing circuitry shown in FIG. 6 shows operation selection logic 613 coupled to a number of logic selection control input control lines, including ISO, TF, TT, FT, and FF. Selection of a logical operation from a plurality of logical operations is determined from the condition of logic selection control signals on the logic selection control input lines, as well as the data values present on the pair of complementary sense lines 605-1 and 605-2 when isolation transistors 650-1 and 650-2 are enabled via an ISO control signal being asserted.

According to various embodiments, the operation selection logic 613 can include four logic selection transistors: logic selection transistor 662 coupled between the gates of the swap transistors 642 and a TF signal control line, logic selection transistor 652 coupled between the gates of the pass gates 607-1 and 607-2 and a TT signal control line, logic selection transistor 654 coupled between the gates of the pass gates 607-1 and 607-2 and a FT signal control line, and logic selection transistor 664 coupled between the gates of the swap transistors 642 and a FF signal control line. Gates of logic selection transistors 662 and 652 are coupled to the true sense line through isolation transistor 650-1 (having a gate coupled to an ISO signal control line). Gates of logic selection transistors 664 and 654 are coupled to the complementary sense line through isolation transistor 650-2 (also having a gate coupled to an ISO signal control line).

Data values present on the pair of complementary sense lines 605-1 and 605-2 can be loaded into the compute component 631 via the pass gates 607-1 and 607-2. The compute component 631 can comprise a loadable shift register. When the pass gates 607-1 and 607-2 are OPEN, data values on the pair of complementary sense lines 605-1 and 605-2 are passed to the compute component 631 and thereby loaded into the loadable shift register. The data values on the pair of complementary sense lines 605-1 and 605-2 can be the data value stored in the sense amplifier 606 when the sense amplifier is fired. In this example, the logical operation selection logic signal, Pass, is high to OPEN the pass gates 607-1 and 607-2.

The ISO, TF, TT, FT, and FF control signals can operate to select a logical function to implement based on the data value ("B") in the sense amplifier 606 and the data value ("A") in the compute component 631. In particular, the ISO, TF, TT, FT, and FF control signals are configured to select the logical function to implement independent from the data value present on the pair of complementary sense lines 605-1 and 605-2 (although the result of the implemented logical operation can be dependent on the data value present on the pair of complementary sense lines 605-1 and 605-2.

For example, the ISO, TF, TT, FT, and FF control signals select the logical operation to implement directly since the data value present on the pair of complementary sense lines 605-1 and 605-2 is not passed through logic to operate the gates of the pass gates 607-1 and 607-2.

Additionally, FIG. 6 shows swap transistors 642 configured to swap the orientation of the pair of complementary sense lines 605-1 and 605-2 between the sense amplifier 606 and the compute component 631. When the swap transistors 642 are OPEN, data values on the pair of complementary sense lines 605-1 and 605-2 on the sense amplifier 606 side of the swap transistors 642 are oppositely-coupled to the pair of complementary sense lines 605-1 and 605-2 on the compute component 631 side of the swap transistors 642, and thereby loaded into the loadable shift register of the compute component 631.

The logical operation selection logic 613 signal Pass can be activated (e.g., high) to OPEN the pass gates 607-1 and 607-2 (e.g., conducting) when the ISO control signal line is activated and either the TT control signal is activated (e.g., high) with data value on the true sense line is "1" or the FT control signal is activated (e.g., high) with the data value on the complement sense line is "1."

The data value on the true sense line being a "1" OPENs logic selection transistors 652 and 662. The data value on the complimentary sense line being a "1" OPENs logic selection transistors 654 and 664. If the ISO control signal or either the respective TT/FT control signal or the data value on the corresponding sense line (e.g., sense line to which the gate of the particular logic selection transistor is coupled) is not high, then the pass gates 607-1 and 607-2 will not be OPENed by a particular logic selection transistor.

The logical operation selection logic signal Pass* can be activated (e.g., high) to OPEN the swap transistors 642 (e.g., conducting) when the ISO control signal line is activated and either the TF control signal is activated (e.g., high) with data value on the true sense line is "1," or the FF control signal is activated (e.g., high) with the data value on the complement sense line is "1." If either the respective control signal or the data value on the corresponding sense line (e.g., sense line to which the gate of the particular logic selection transistor is coupled) is not high, then the swap transistors 642 will not be OPENed by a particular logic selection transistor.

The Pass* control signal is not necessarily complementary to the Pass control signal. It is possible for the Pass and Pass* control signals to both be activated or both be deactivated at the same time. However, activation of both the Pass and Pass* control signals at the same time shorts the pair of complementary sense lines together, which may be a disruptive configuration to be avoided.

The sensing circuitry illustrated in FIG. 6 is configured to select one of a plurality of logical operations to implement directly from the four logic selection control signals (e.g., logical operation selection is not dependent on the data value present on the pair of complementary sense lines). Some combinations of the logic selection control signals can cause both the pass gates 607-1 and 607-2 and swap transistors 642 to be OPEN at the same time, which shorts the pair of complementary sense lines 605-1 and 605-2 together. According to a number of embodiments of the present disclosure, the logical operations which can be implemented by the sensing circuitry illustrated in FIG. 6 can be the logical operations summarized in the logic tables shown in FIG. 7.

FIG. 7 is a logic table illustrating selectable logic operation results implemented by a sensing circuitry shown in FIG. 6 in accordance with a number of embodiments of the present disclosure. The four logic selection control signals (e.g., TF, TT, FT, and FF), in conjunction with a particular data value present on the complementary sense lines, can be used to select one of plural logical operations to implement involving the starting data values stored in the sense amplifier 606 and compute component 631. The four control signals, in conjunction with a particular data value present on the complementary sense lines, controls the continuity of the pass gates 607-1 and 607-2 and swap transistors 642, which in turn affects the data value in the compute component 631 and/or sense amplifier 606 before/after firing. The capability to selectably control continuity of the swap transistors 642 facilitates implementing logical operations involving inverse data values (e.g., inverse operands and/or inverse result), among others.

Logic Table 7-1 illustrated in FIG. 7 shows the starting data value stored in the compute component 631 shown in column A at 744, and the starting data value stored in the sense amplifier 606 shown in column B at 745. The other 3 column headings in Logic Table 7-1 refer to the continuity of the pass gates 607-1 and 607-2, and the swap transistors 642, which can respectively be controlled to be OPEN or CLOSED depending on the state of the four logic selection control signals (e.g., TF, TT, FT, and FF), in conjunction with a particular data value present on the pair of complementary sense lines 605-1 and 605-2. The "Not Open" column corresponds to the pass gates 607-1 and 607-2 and the swap transistors 642 both being in a non-conducting condition, the "Open True" corresponds to the pass gates 607-1 and 607-2 being in a conducting condition, and the "Open Invert" corresponds to the swap transistors 642 being in a conducting condition. The configuration corresponding to the pass gates 607-1 and 607-2 and the swap transistors 642 both being in a conducting condition is not reflected in Logic Table 7-1 since this results in the sense lines being shorted together.

Via selective control of the continuity of the pass gates 607-1 and 607-2 and the swap transistors 642, each of the three columns of the upper portion of Logic Table 7-1 can be combined with each of the three columns of the lower portion of Logic Table 7-1 to provide 3×3=9 different result combinations, corresponding to nine different logical operations, as indicated by the various connecting paths shown at 775. The nine different selectable logical operations that can be implemented by the sensing circuitry are summarized in Logic Table 7-2 illustrated in FIG. 7.

The columns of Logic Table 7-2 illustrated in FIG. 7 show a heading 780 that includes the state of logic selection control signals. For example, the state of a first logic selection control signal is provided in row 776, the state of a second logic selection control signal is provided in row 777, the state of a third logic selection control signal is provided in row 778, and the state of a fourth logic selection control signal is provided in row 779. The particular logical operation corresponding to the results is summarized in row 747.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory device comprising a system processor resident thereon; and
a plurality of memory banks resident on the memory device, wherein at least one memory bank of the plurality of memory banks comprises a bank processor resident thereon;
wherein the system processor is configured to orchestrate execution of processing-in-memory (PIM) instructions by the bank processor of the at least one memory bank without transferring data via an input/output (I/O) interface that couples the memory device to a host.

2. The apparatus of claim 1, wherein the system processor is a reduced instruction set computer (RISC) processor.

3. The apparatus of claim 2, wherein the system processor is a RISC-V processor.

4. The apparatus of claim 2, wherein the bank processor of the at least one memory bank is a RISC-V processor.

5. The apparatus of claim 1, wherein the system processor is a RISC-V processor having increased processing capability as compared to the bank processor of the at least one memory bank.

6. The apparatus of claim 1, wherein the at least one memory bank of the plurality of memory banks includes an instruction cache.

7. The apparatus of claim 1, wherein the at least one memory bank of the plurality of memory banks includes a bank-to-bank transfer cache.

8. The apparatus of claim 1, wherein the I/O interface is a double date rate (DDR) interface.

9. An apparatus, comprising:
a host;
a memory device coupled to the host and comprising:
a system processor resident on the memory device; and
a plurality of memory banks comprising respective bank processors;
wherein the system processor is configured to orchestrate execution of processing-in-memory (PIM) instructions by the respective bank processors of the plurality of memory banks without transferring data via an input/output (I/O) interface that couples the memory device to the host.

10. The apparatus of claim 9, further comprising a bank-to-bank transfer bus coupled to the plurality of memory banks via a periphery data path.

11. The apparatus of claim 10, wherein the memory device comprises a direct memory access (DMA) component coupled to the periphery data path.

12. The apparatus of claim 10, wherein the bank-to-bank transfer bus provides a data path over which data may be transferred between the plurality of memory banks.

13. The apparatus of claim 9, wherein the system processor comprises a RISC-V processor.

14. The apparatus of claim 9, wherein at least one of the respective bank processors comprises a RISC-V processor.

15. The apparatus of claim 9, wherein the host comprises one or more of a computer, a smartphone, and an internet-of-things device.

16. The apparatus of claim 9, wherein at least one of the plurality of memory banks includes a number of extended row address components configured to operate as caches for the system processor.

17. An apparatus, comprising:
a host;
a memory device coupled to the host and comprising:
a plurality of memory banks comprising respective bank processors; and
a system processor resident on the memory device, wherein the system processor serves as a supervisory processing device to control operation of the respective bank processors in association with executing a program without transferring data via an input/output (I/O) interface that couples the memory device to the host.

18. The apparatus of claim 17, wherein the memory device includes an instruction cache configured to store instructions for the system processor.

19. The apparatus of claim 18, wherein the memory device includes a bank-to-bank transfer cache.

20. The apparatus of claim 18, wherein the respective bank processors are RISC-V processors and wherein the instruction cache is configured to store RISC-V instructions.

* * * * *